United States Patent [19]
Johnson et al.

[11] Patent Number: 5,933,369
[45] Date of Patent: *Aug. 3, 1999

[54] RAM WITH SYNCHRONOUS WRITE PORT USING DYNAMIC LATCHES

[75] Inventors: Robert Anders Johnson, San Jose; Richard A. Carberry, Los Gatos; Scott K. Roberts, Auburn, all of Calif.

[73] Assignee: Xilinx, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/808,447

[22] Filed: Feb. 28, 1997

[51] Int. Cl.$^6$ ........................................... G11C 7/00
[52] U.S. Cl. ................ 365/189.05; 365/189.02; 365/193; 365/194; 365/210; 365/230.02; 365/230.08; 365/233
[58] Field of Search .................. 365/189.05, 230.08, 365/233, 194, 193, 210, 230.02, 189.02

[56] References Cited

U.S. PATENT DOCUMENTS

| | | | |
|---|---|---|---|
| 5,566,123 | 10/1996 | Freidin et al. | 365/230.05 |
| 5,687,134 | 11/1997 | Sugawara et al. | 365/189.05 X |
| 5,708,614 | 1/1998 | Koshikawa | 365/189.05 X |

*Primary Examiner*—Do Hyun Yoo
*Attorney, Agent, or Firm*—Edel M. Young; E. Eric Hoffman

[57] ABSTRACT

Dynamic latches for writing to a synchronous RAM are controlled by a clock signal and a delay circuit so that the dynamic latches will not stay in a latched state for more than a selected time interval regardless of the clock signal. One delay circuit limits the length of a write enable signal. Another delay circuit responds to the write enable signal and after a delay returns the address and data latches to their transparent states.

18 Claims, 19 Drawing Sheets

| Figure 8A |
|---|
| Figure 8B |

| Figure 9A |
|---|
| Figure 9B |

| Figure 10A |
|---|
| Figure 10B |

RAM WITH SYNCHRONOUS WRITE PORT USING DYNAMIC LATCHES

FIELD OF THE INVENTION

The invention relates to integrated circuit random access memories (RAMs), more particularly to RAMs with synchronous write ports.

BACKGROUND OF THE INVENTION

Both synchronous and asynchronous RAMs are well known. RAMs are arrays of memory cells that can be read or written to on a set of data lines when addressed on a set of address lines. The state of an asynchronous RAM may transition as soon as any of its inputs change, whereas the state of a synchronous RAM changes only at the transition of a clock signal.

FIGS. 1 and 1a

FIG. 1 shows an asynchronous RAM. When write enable line WE carries a signal that is not active (low in this example), data can be read but not written. When WE is low, an address placed onto address bus ADDRESS(0:n) causes data located in the addressed location to be placed onto data out lines DATA_OUT where the data can be read. When write enable line WE carries an active high signal, an address placed onto address bus ADDRESS(0:n) causes data on data-in bus DATA_IN to be loaded into the addressed location of asynchronous RAM 105. FIG. 1a shows a timing diagram for signals related to asynchronous RAM 105. The shaded areas indicate times when either a signal is invalid or the state is unimportant. An address ADDRESS(0:n) placed at time T1 causes the addressed data to appear at DATA_OUT a short time later, where it can be read. For writing, at time T2, write enable signal WE goes high and causes data on the DATA_IN bus to be loaded into the addressed location and to appear on DATA_OUT. In order for data to be loaded into the proper memory location, the address must be stable before write enable signal WE goes high. This time difference between T1 and T2 is called the address set-up time and is a requirement made by the chip manufacturer of the user of the chip in order to assure proper writing of data. At time T3, when new data appear at DATA_IN, since WE is still high, these new data are loaded into the addressed location of RAM 105 and appear at DATA_OUT. At time T4, WE goes low and thus prevents further changes in DATA_IN from being loaded or affecting DATA_OUT. The time between T3 when new data appear and T4 when WE goes low is the data set-up time, and must be sufficient to assure proper writing of data. The time between T4 and T5 is the data hold time and is again a requirement made by the chip manufacturer in order to assure proper writing. In some circuits the data hold time is designed to be zero or negative. Thus, at time T5 when DATA_IN again changes there is no change in DATA_OUT. Finally, at time T6, when ADDRESS(0:n) changes, the value on DATA_OUT no longer represents the data previously addressed. The time difference between T4 and T6 is called the address hold time, and is another requirement made by the manufacturer. The address and data hold time requirements are not necessarily equal. Finally, the time between T2 and T4 is the write enable pulse width, and is a further requirement made by the IC manufacturer.

This asynchronous RAM has the disadvantages of causing unnecessary switching of DATA_OUT (switching consumes power) if DATA_IN switches after time T2, and may cause data errors if DATA_OUT is read when the incorrect value is present. Also, set-up and hold time requirements may increase cost of a system in which the chip is used.

To avoid such errors and costs, a synchronous RAM can be used. A synchronous RAM receives or provides data only in response to a clock signal. A synchronous RAM can be formed by adding to an asynchronous RAM an input structure for receiving input signals and a clock signal, and providing the input signals to the asynchronous RAM at specified times.

FIGS. 2 and 2a

FIG. 2 shows a synchronous RAM 205. Latches 101 and 102, D flip flop 103 (comprising latches 503 and 504), and delay unit 104 comprise the input structure for providing the signals to asynchronous RAM 105. Delay unit 104 assures that latched write enable signal WE_L remains high long enough for data to be written into memory 105, and satisfies the pulse width requirement for write strobe port WS. In response to clock signal K going high, address signals ADDRESS(0:n) and data signals DATA_IN are latched into latches 101 and 102 and generate latched output signals LADDR and LDATA. A write enable signal WE is also loaded into flip flop 103 in response to clock signal K going high, and generates latched output signal WE_L. When a high signal WE_L is applied to the write strobe port WS of asynchronous RAM 105, the signal LDATA is stored in asynchronous RAM 105 in the location specified by LADDR, and can be read as a data out signal DOUT on the DATA_OUT bus.

Timing of these signals is shown in FIG. 2a. On the rising edge of clock signal K, write enable signal WE is detected. If write enable signal WE is logical 0, for example, at time T0, a write operation is not enabled, and flip flop 103 maintains its output signal WE_L at logical 0 and no values are written into asynchronous RAM 105.

At time T1, while clock signal K is low, write enable signal WE goes high. Bubbles at the clock terminals of latches 101, 102, and 503 (FIG. 2) indicate that when clock signal K is low, latches 101, 102, and 503 are transparent. Thus, address signals ADDRESS(0:n) at the inputs of latch 101 and data signal DATA_IN at the inputs of latch 102 are transferred to the latch output lines as signals LADDR(0:n) and LDATA. Similarly, the high WE signal is transferred to the input of slave latch 504.

At time T2, which is before clock signal K goes high, the address and data signals ADDRESS(0:n) and DATA_IN become valid, as indicated by the ending of the shaded areas., As LADDR(0:n) becomes valid, the data in the location specified by LADDR(0:n) is output to DATA_OUT.

At time T3, clock signal K goes high. This causes the high WE signal to be transferred to WE_L and to start a delayed high signal from delay unit 104. The delay is selected to be sufficient for writing to the selected memory cell (or cells). The high K signal also places latches 101 and 102 into a latched state so that further changes in ADDRESS(0:n) and DATA_IN do not affect LADDR(0:n), LDATA, or DATA_OUT.

A short time later, at time T4, the data output signal DATA_OUT reflects the new value written to the RAM, namely LDATA.

Signals LADDR(0:n) and LDATA must remain valid until time T5 when delay unit 104 causes flip flop 103 to be reset and WE_L to go low. However, ADDRESS(0:n) and DATA_IN need not remain valid since their information has been latched into latches 101 and 102. The high period of clock signal K is required by the chip manufacturer to be no less than the delay of delay unit 104.

At time T6, when clock signal K goes low, signals LADDR(0:n) and LDATA become invalid. Loss of the valid address in turn causes the output data signal DATA_OUT to become invalid shortly after time T6. However DATA_OUT is valid from time T4 until shortly after time T6, and can be received as a data input signal elsewhere in the circuit during this time window.

FIGS. 3a and 3b

Latches 101 and 102 may be static or dynamic latches. Static latches usually require 5 to 8 transistors for each bit of data whereas dynamic latches require only three transistors per bit. FIGS. 3a and 3b show static and dynamic latches respectively. In FIG. 3a, inverters 602 and 603 are connected into a loop by transistor 604 so that a value can be stored indefinitely in the latch as long as power is applied to the inverters. To write to the static latch, a rising clock signal CLK turns on transistor 601 and turns off transistor 604, thereby allowing an input data value, for example the DATA_IN value of latch 102 of FIG. 2, to be applied to node Q,. The complement Qbar is applied to inverter 603. When CLK goes low, transistor 601 turns off, so DATA_IN is no longer applied to the static latch and transistor 604 turns on, thus closing the loop and retaining the value. Thus the static latch of FIG. 3a is stable but large.

The dynamic latch of FIG. 3b relies on the capacitance at node Q to retain the state of inverter 602. When CLK goes low, node Q is disconnected from the DATA_IN signal. Because of leakage represented by parasitic diode 606 and the subthreshold leakage of transistor 601, this dynamic latch holds the value at Q on the order of a millisecond after CLK is brought low. If CLK remains low for a long enough period, node Q floats to an intermediate value with two negative results: (1) latch data may be lost, and (2) the inverter begins to conduct high current between the positive and ground voltage supplies, which in some cases can destroy an integrated circuit device. In a circuit such as shown in FIG. 2, the write enable signal WE_L is high only briefly while new data are being entered into RAM 105, therefore a dynamic latch such as shown in FIG. 3b is appropriate. However, this dynamic latch may not be used when K stays high for an unpredictable duration. In FIG. 2a, the signals LADDR(0:n) and LDATA are shown as becoming invalid before K goes low. To prevent this situation, the IC manufacturer has required users of the IC device to maintain clock signal K high only for brief periods. This requirement has been a burden to system makers using chips having dynamic latches. Using static latches will maintain the latched signals stable indefinitely but the larger area is undesirable if there are many latches.

It would be preferred to continue using dynamic latches rather than the larger static latches but avoid minimum switching speed requirements on a clock signal K for controlling synchronous RAM.

SUMMARY OF THE INVENTION

According to the invention, a structure is provided for controlling dynamic latches so as to return them to their transparent mode shortly after a clock signal causes latching. In a situation where the controlling structure controls many dynamic latches, the structure requires less silicon area than replacing all the dynamic latches with static latches.

In addition to the prior art delay circuit that converts a write enable signal to a write strobe signal, a latch return delay circuit is activated by the write enable signal and clock signal and after a delay period returns the dynamic latches to their transparent modes. The delay period is sufficient for writing to the RAM memory but not so long as to allow the dynamic latches to lose their information or move to high current intermediate states.

One embodiment of the invention starts the latch return delay circuit from the signal between the master and slave portions of the write enable flip flop. Another embodiment generates the latch return delay from a clock delay circuit and the write strobe delay circuit.

In one application of the invention, a single controlling structure controls about twenty dynamic latches that are part of a dual port RAM.

DETAILED DESCRIPTION OF THE PREFERRED EMBODIMENTS

Figure 4:
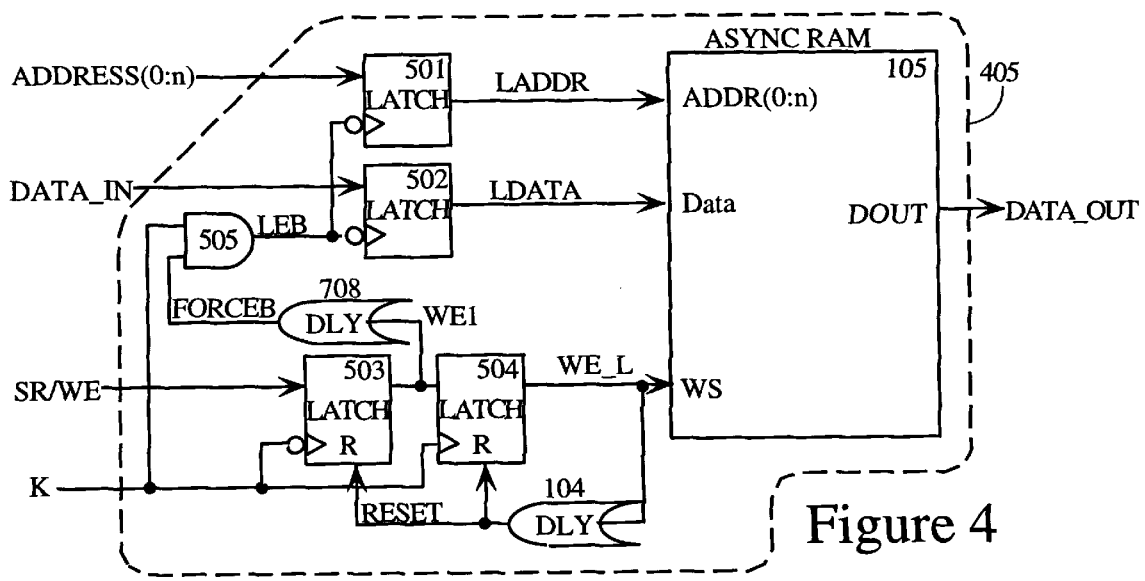
FIG. 4 shows a first embodiment of the synchronous RAM according to the invention.
Figure 4A:
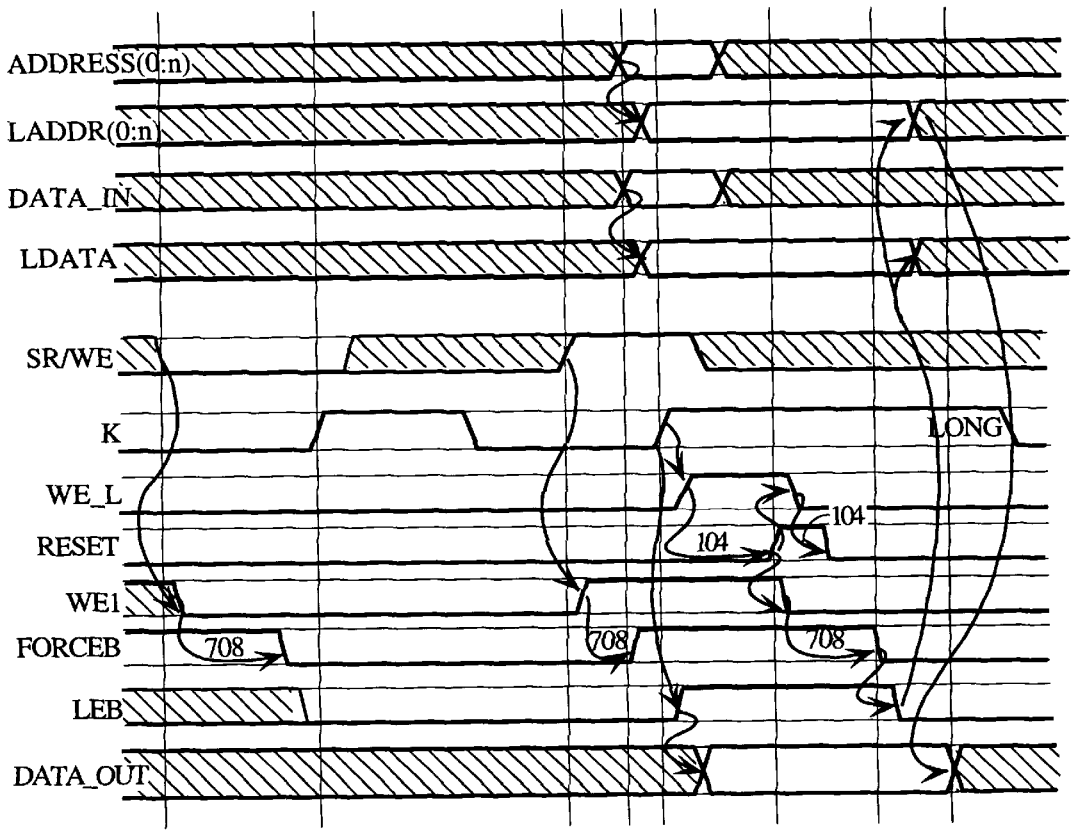
FIG. 4a shows a timing diagram for signals in the synchronous RAM of FIG. 4.

FIGS. 4 and 4a

Figure 2:
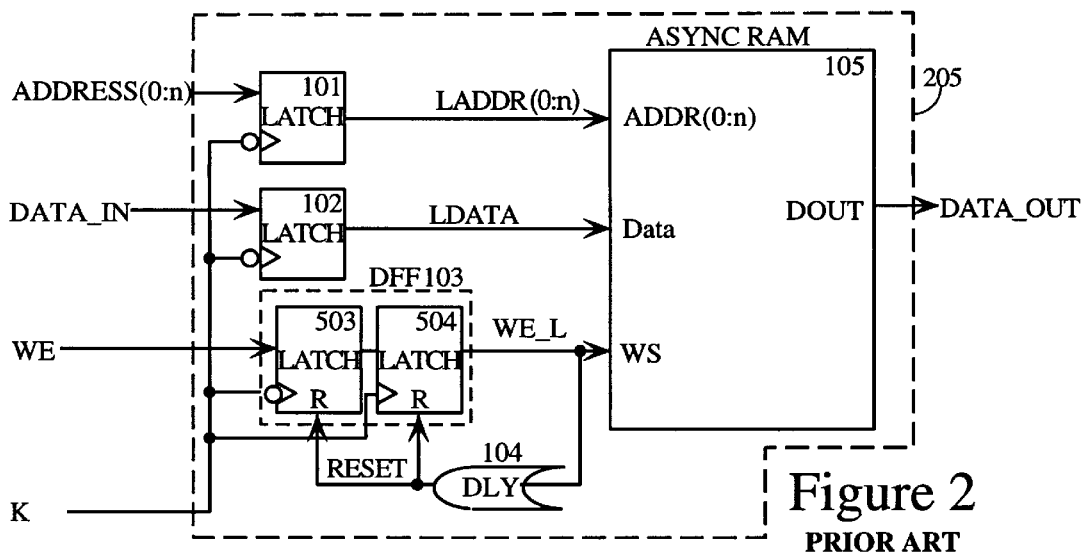
FIG. 2 shows a prior art synchronous RAM.
Figure 2A:
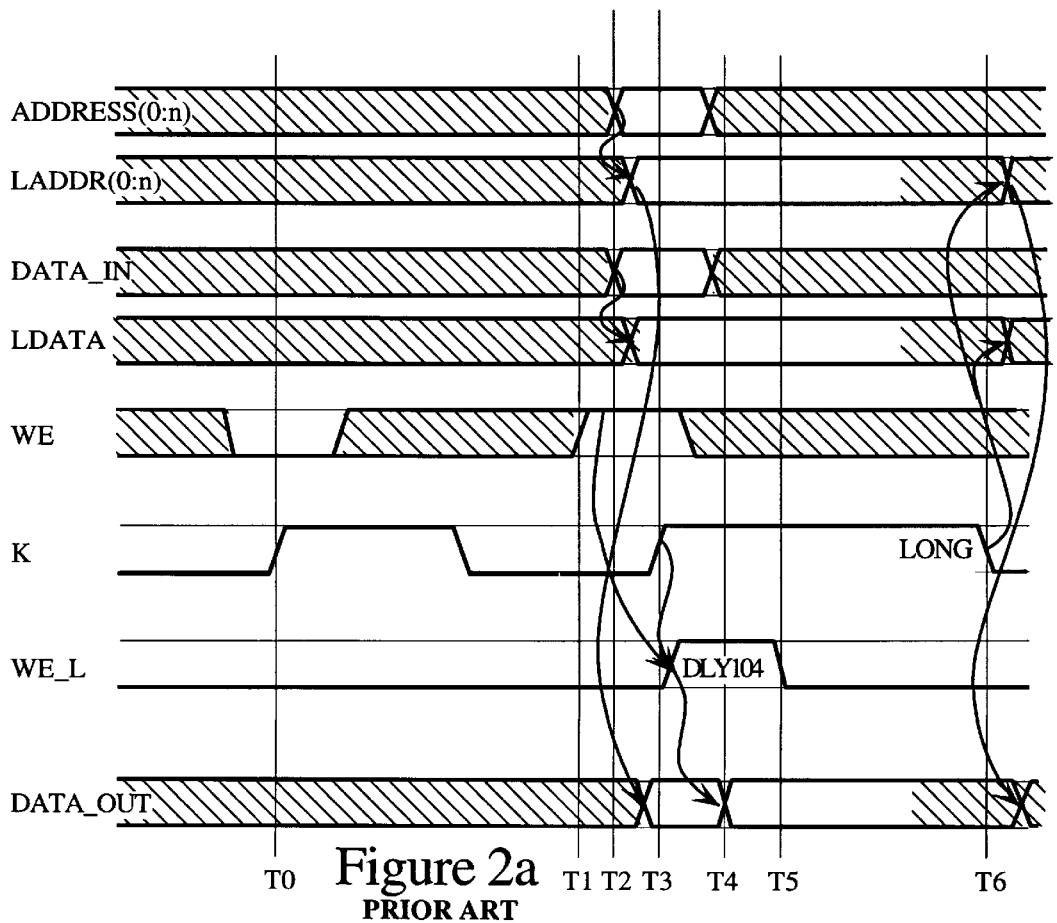
FIG. 2a shows a timing diagram for signals in the synchronous RAM of FIG. 2.

FIG. 4 shows a synchronous RAM 405 according to the invention. FIG. 4a shows a timing diagram for signals in the synchronous RAM of FIG. 4. These two figures will be discussed together. Latches 501 and 502 are dynamic latches. Latches 503 and 504 are constructed and coupled together such that in combination they behave as a positive edge triggered D flip-flop with an asynchronous RESET input. Delay element 708 takes its input signal from the output of master latch 503. After a specified delay sufficient to allow data to be clocked into asynchronous RAM 105, the high RESET signal generated by delay unit 104 causes latch 503 to generate a low output signal, which after the delay of delay element 708 causes AND gate 505 to pull signal LEB low and return dynamic latches 501 and 502 to their transparent states. In FIG. 4, as in FIG. 2, set-reset/write-enable signal SR/WE will be detected on the rising edge of clock signal K. When set-reset/write-enable signal SR/WE has been low for a sufficient period of time, latched write-enable signal WE_L will be low, RESET will be low (inactive) and master latch output WE1 will be low. Thus the FORCEB signal will be low and therefore latch enable signal LEB is low regardless of clock signal K. In this case, no address and data are latched into latches 501 and 502. For example, at time T0, when clock signal K goes high, set-reset/write-enable signal SR/WE is low. Therefore, no data are written into RAM 105.

At time T1, set-reset/write-enable signal SR/WE goes high, thus causing WE1 to go high, starting a delayed high signal in delay unit 708. At time T2, shortly before clock signal K goes high, the ADDRESS(0:n) and DATA_IN signals must be valid. SR/WE must be brought high early enough before the rising edge of K that the rising edge of FORCEB precedes the rising edge of K. Otherwise, the hold requirement on ADDRESS(0:n) and DATA_IN will have to be increased.

Figure 4B:
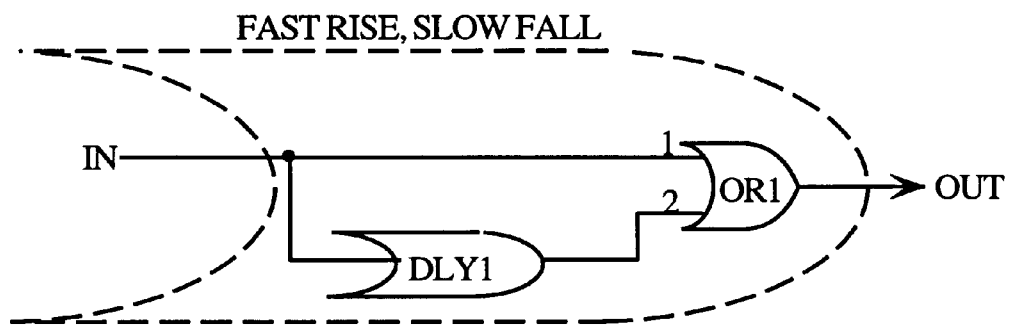
FIGS. 4b and 4c show circuits for generating asymmetrical delay circuits usable in FIG. 4.
Figure 4C:
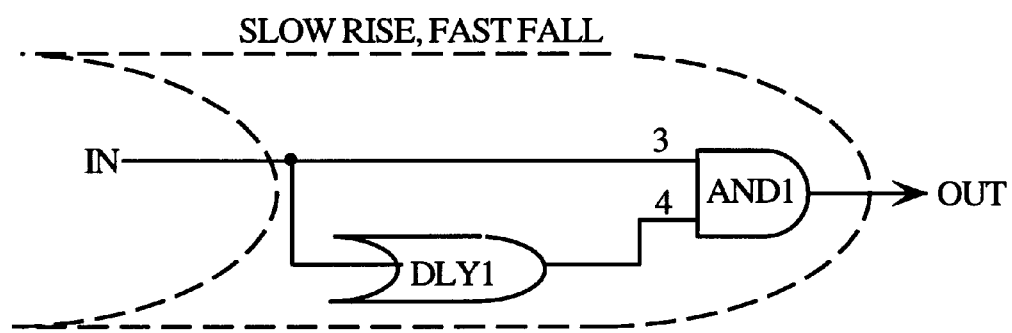

The SR/WE setup time requirement is relaxed by making the delay of element 708 after a rising edge of WE1 as short as possible. In FIG. 4a, the delay of element 708 around time T2 is shorter than the delay after time T4. FIGS. 4b and 4c show circuits for achieving unbalanced delay. Circuits shown in FIGS. 4b and 4c are commonly used to smooth noise spikes and are referred to as glitch eaters. In FIG. 4b, when input signal IN goes high, OR gate OR1 receives this high signal almost immediately on line 1 and responds by providing a high output signal without waiting for DLY1. When input signal IN goes from high to low, the high value output from DLY1 keeps OUT high until the low signal has propagated through DLY1. Thus the circuit of FIG. 4b exhibits a fast rise and a slow fall in response to input signal IN. Similarly the circuit of FIG. 4c achieves a slow rise and fast fall because when input signal IN goes from low to high, AND gate AND1 remains low until the high signal has propagated through DLY1, but goes low immediately when input signal IN causes line 3 to go low.

Thus a circuit such as shown in FIG. 4b is preferred for delay element 708 of FIG. 4.

After a set-up time starting at time T2, at time T3, clock signal K goes high, causing signal LEB to go high, which prevents further changes in ADDRESS(0:n) and DATA_IN from disturbing LADDR(0:n) and LDATA. The high-going clock signal K also causes latched write-enable signal WE_L to go high, initiating write strobe delay 104. At time T4, after write strobe delay 104 has timed out, RESET goes high, pulling down the outputs of latches 503 and 504. Thus master latch output signal WE1 goes low, initiating a low signal in delay unit 708. Meanwhile, latched write-enable signal WE_L goes low initiating another write strobe delay 104, after which RESET returns low. Delay element 104 must be constructed such that the delay from the rising edge of WE_L to the falling edge of WE_L is always more than the delay from the rising edge of WE_L to the transition of the state of the addressed memory cell or cells in the RAM in order for the RAM to be written reliably. In addition, it is preferable that in order for RAM 405 to be prepared to respond to a subsequent write cycle as soon as possible, the delay of element 104 in response to a falling WE_L signal should be as short as possible. A delay circuit such as shown in FIG. 4c can produce this result.

At time T5, after delay unit 708 has timed out, the FORCEB signal falls and causes the LEB output of AND gate 505 to go low, thus returning dynamic latches 501 and 502 to their transparent states. This means that the address and data values are no longer valid. Since WE_L has gone low, no writing takes place, and at time T6 DATA_OUT ceases to be valid. Delay element 708 must be constructed such that the delay from RESET rising to WE_L falling is always less than the delay from RESET rising to LEB falling. Otherwise, LADDR or LDATA might change too early with respect to the falling edge of WE_L, thus violating the hold time requirements of asynchronous RAM 105 and writing erroneous data into RAM 105.

If latches 501 and 502 are wide latches (32-bit address and 16-bit data, for example), the small increase in area for providing delay unit 708 and AND gate 505 to generate latch enable signal LEB as a substitute for clock signal K achieves a stable RAM at much lower cost in silicon area than replacing dynamic latches 501 and 502 with static latches.

Figure 5:
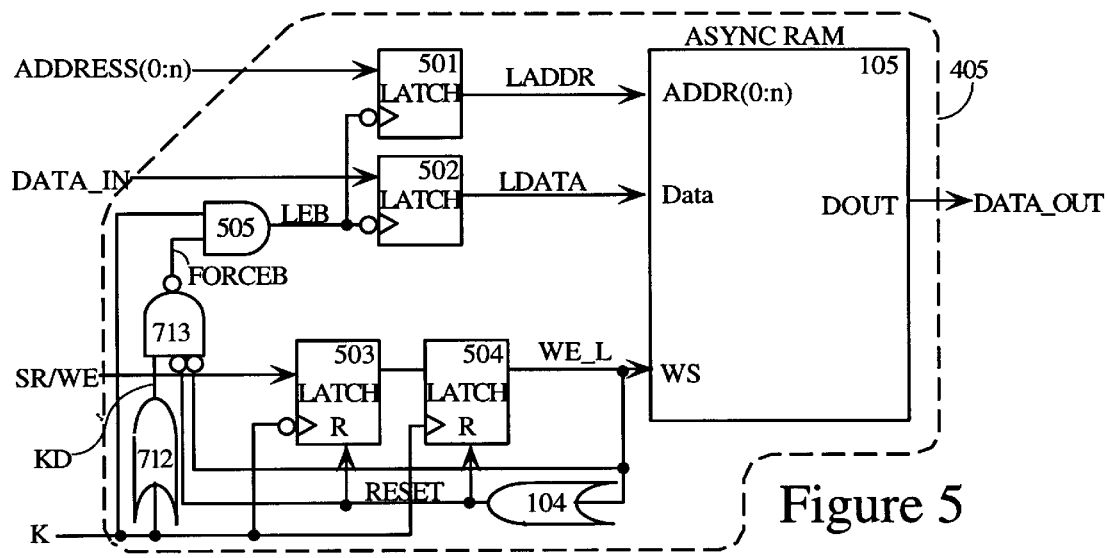
FIG. 5 shows a second embodiment of the synchronous RAM according to the invention.
Figure 5A:
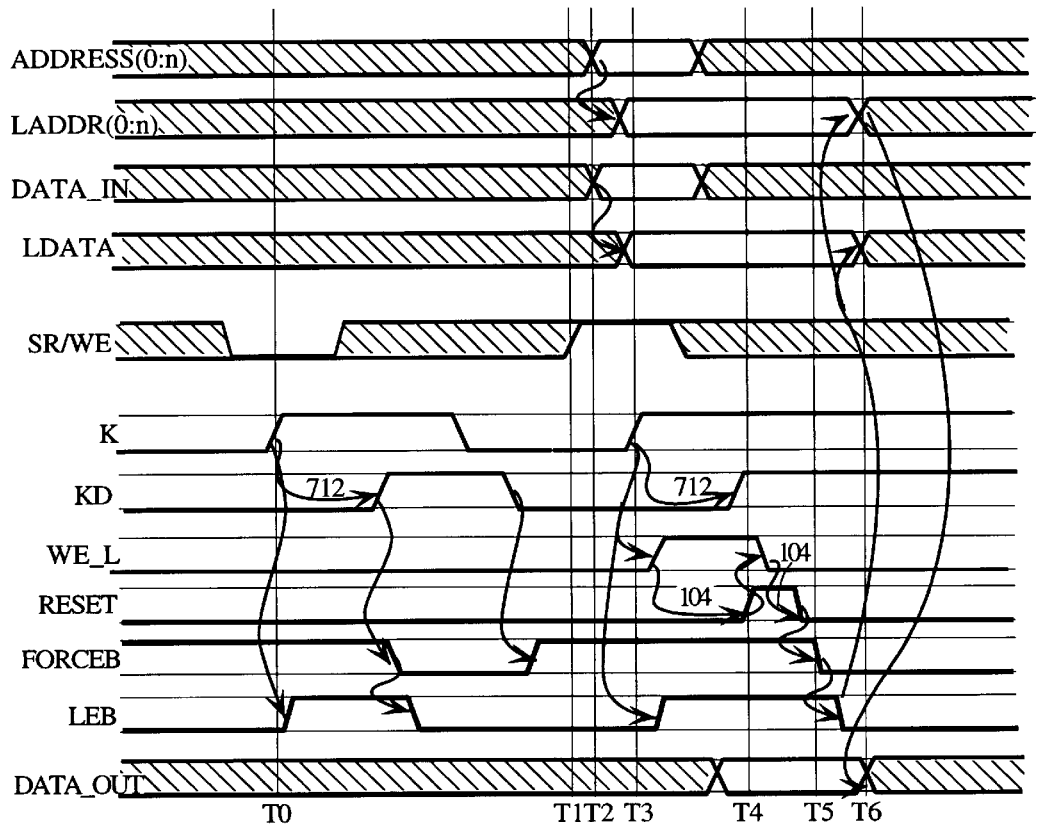
FIG. 5a shows a timing diagram for signals in the synchronous RAM of FIG. 5.

FIGS. 5 and 5a

FIG. 5 shows another embodiment of the invention and FIG. 5a shows an associated timing diagram. The embodiment of FIG. 5 produces latch enable signal LEB without increasing the required set-up time before SR/WE can be brought high. In the embodiment of FIG. 4, because DLY 708 is derived from SR/WE, SR/WE must be set up well before clock signal K goes high so that FORCEB will be high and AND gate 505 can respond to the high going clock signal K. In FIG. 5, because FORCEB does not depend on SR/WE, clock signal K can go high very shortly after SR/WE goes high. As another advantage, the falling edge of the LEB signal occurs later with respect to the falling edge of WE_L, which reduces the possibility of corrupting LADDR or LDATA before write enable signal WE_L falls. In FIG. 5, delay element 104 operates as in FIG. 4, and therefore has the same requirements and preferred asymmetrical timing. In FIG. 5, delay element 712 must rise late enough that a rising clock signal K causes WE_L to go high before the KD signal goes high so that the FORCEB signal does not momentarily go low (glitch low) when K rises, causing LEB to go low, making latches 501 and 502 transparent, possibly corrupting LADDR and LDATA so that RAM 105 could receive bad data. As a disadvantage of the FIG. 5 embodiment, note that clock signal K must remain low for a sufficient time that output signal KD from delay element 712 is low and FORCEB is therefore high, so that AND gate 505 can respond to the high-going clock signal K. Thus the manufacturer must place a minimum low clock signal requirement on the user. To minimize the minimum low time for clock signal K, delay element 712 should go low as quickly as possible in response to K going low, because FORCEB must be high before the next rising edge of K in order to avoid increasing the hold requirement on ADDRESS(0:n) and DATA_IN.

Figure 6:
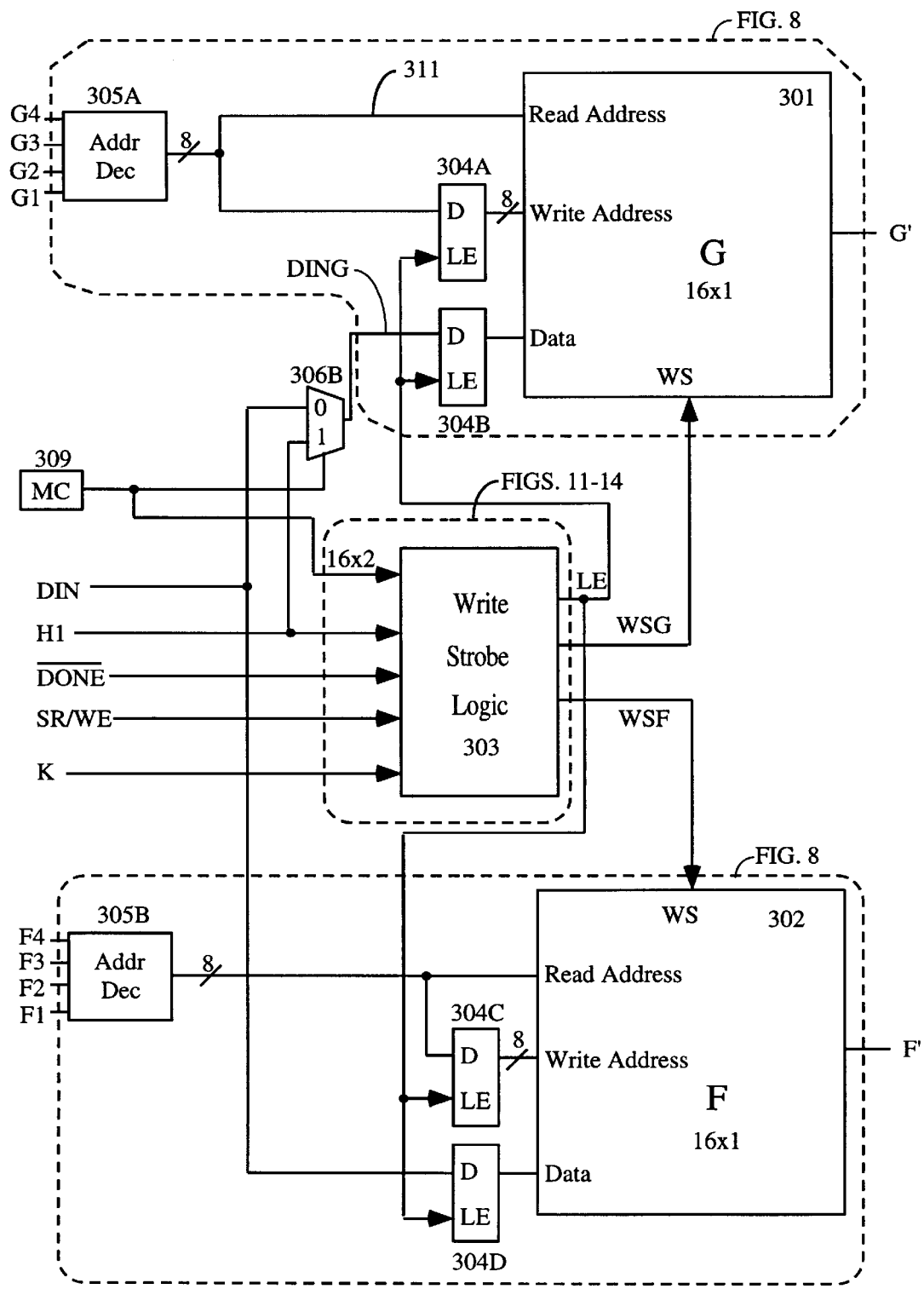
FIGS. 6 and 7 show synchronous single-port and dual-port RAM structures in which the invention may advantageously be used.
Figure 7:
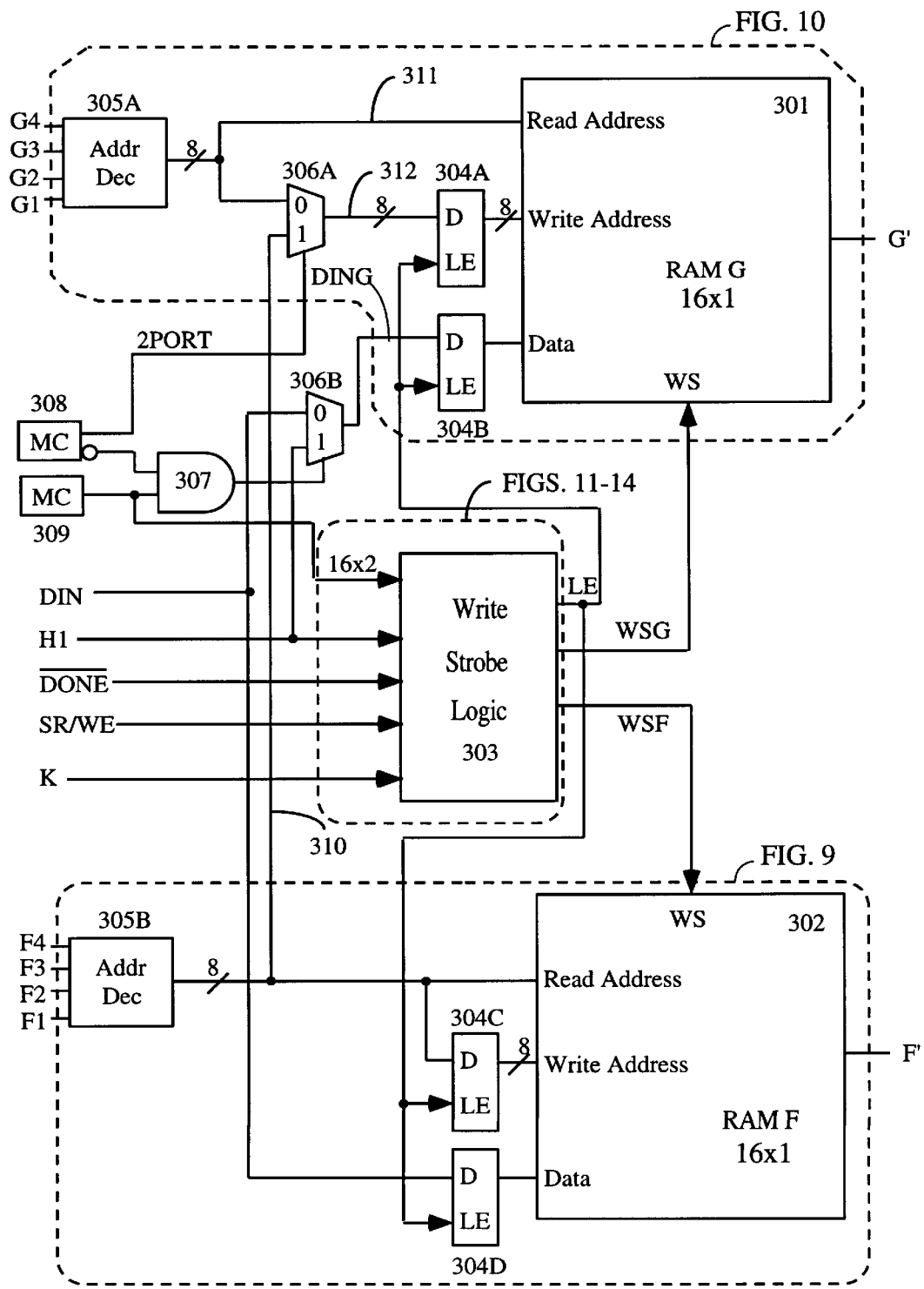

FIGS. 6 and 7

Figure 3A:
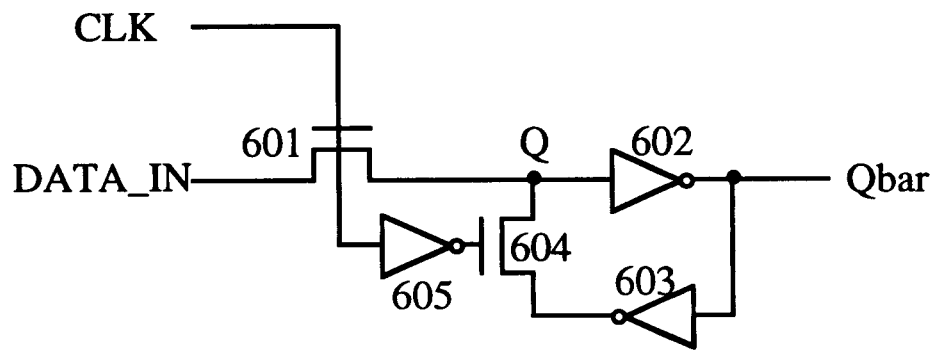
FIGS. 3a and 3b show prior art static and dynamic latches.
Figure 3B:
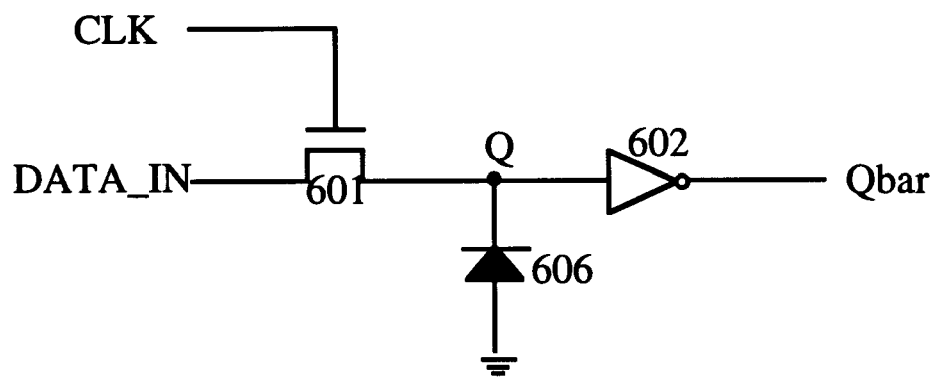

FIG. 6 shows a single-port RAM control structure in which the invention may advantageously be used. FIG. 7 shows a dual-port RAM structure in which the invention may advantageously be used. In both FIG. 6 and FIG. 7, the circuit of the invention for controlling dynamic latches can be placed in write strobe logic unit 303. Write strobe logic unit 303 generates latch enable signal LE (active high), which controls dynamic latches 304A through 304D, equivalent to dynamic latches 501 and 502 of FIGS. 4 and 5. The circuit of FIG. 7 is shown by Freidin et al. in FIG. 3 of U.S. Pat. No. 5,566,123 [docket X-137] issued Oct. 15 1996, "Synchronous Dual Port Ram", and discussed in detail in that patent. FIG. 6 is a similar figure, showing a single port RAM formed from two function generators F and G, each having 16 memory cells. The function generators F and G can be used as one 16×2 RAM, two 16×1 RAMs, one 32×1 RAM, one 16×1 RAM plus one lookup table, or two lookup tables, as controlled by configuration memory cell 309 as well as the two memory cells MC of FIG. 11a or configuration memory cells 519 and 520 in FIG. 11b. A data-in bus DIN provides input data and output lines F' and G' provide output data. Addresses are provided on lines F1 through F4 and G1 through G4. Signal H1 may provide either additional address or additional data, depending on the state of memory cell 309.

Figures 8, 8A:
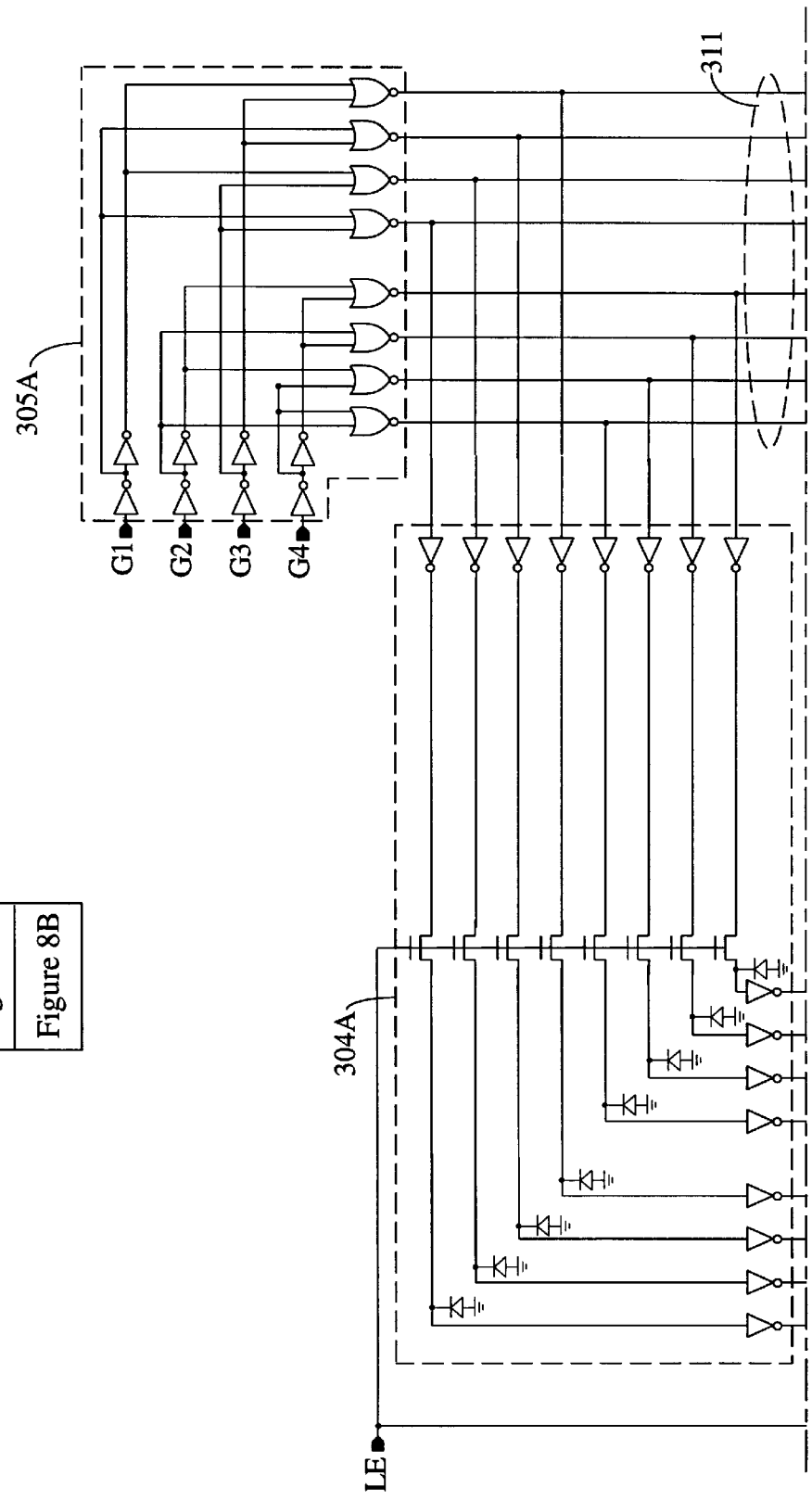
FIG. 8 shows the single-port RAM and its control latches identified in FIG. 6.
Figures 9, 9A:
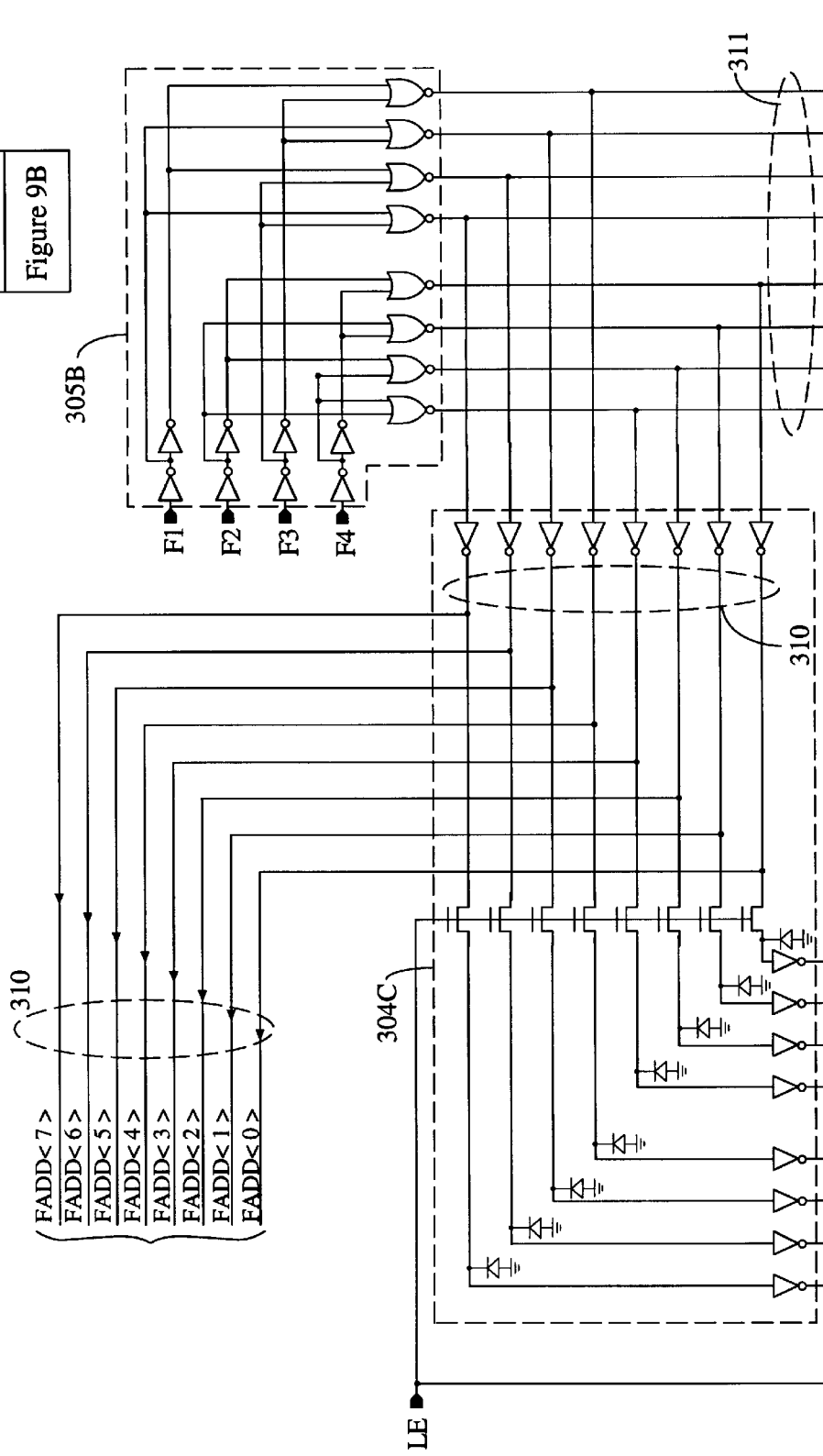
FIGS. 9 and 10 which consist of FIGS. 9A–9B and 10A–10B, respectively, show the two ports of the dual-port RAM identified in FIG. 7.
Figure 9B:
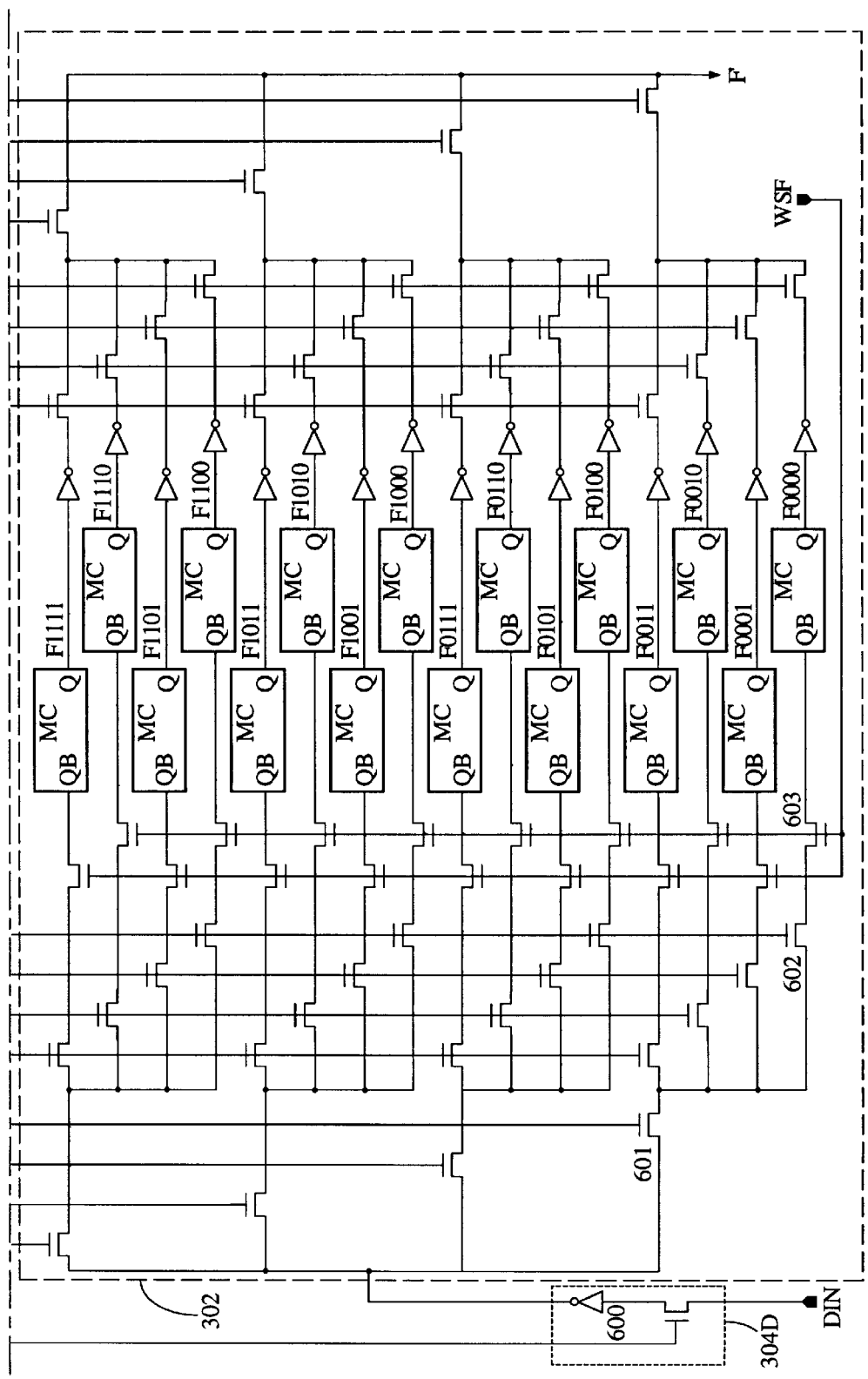
Figures 10, 10A:
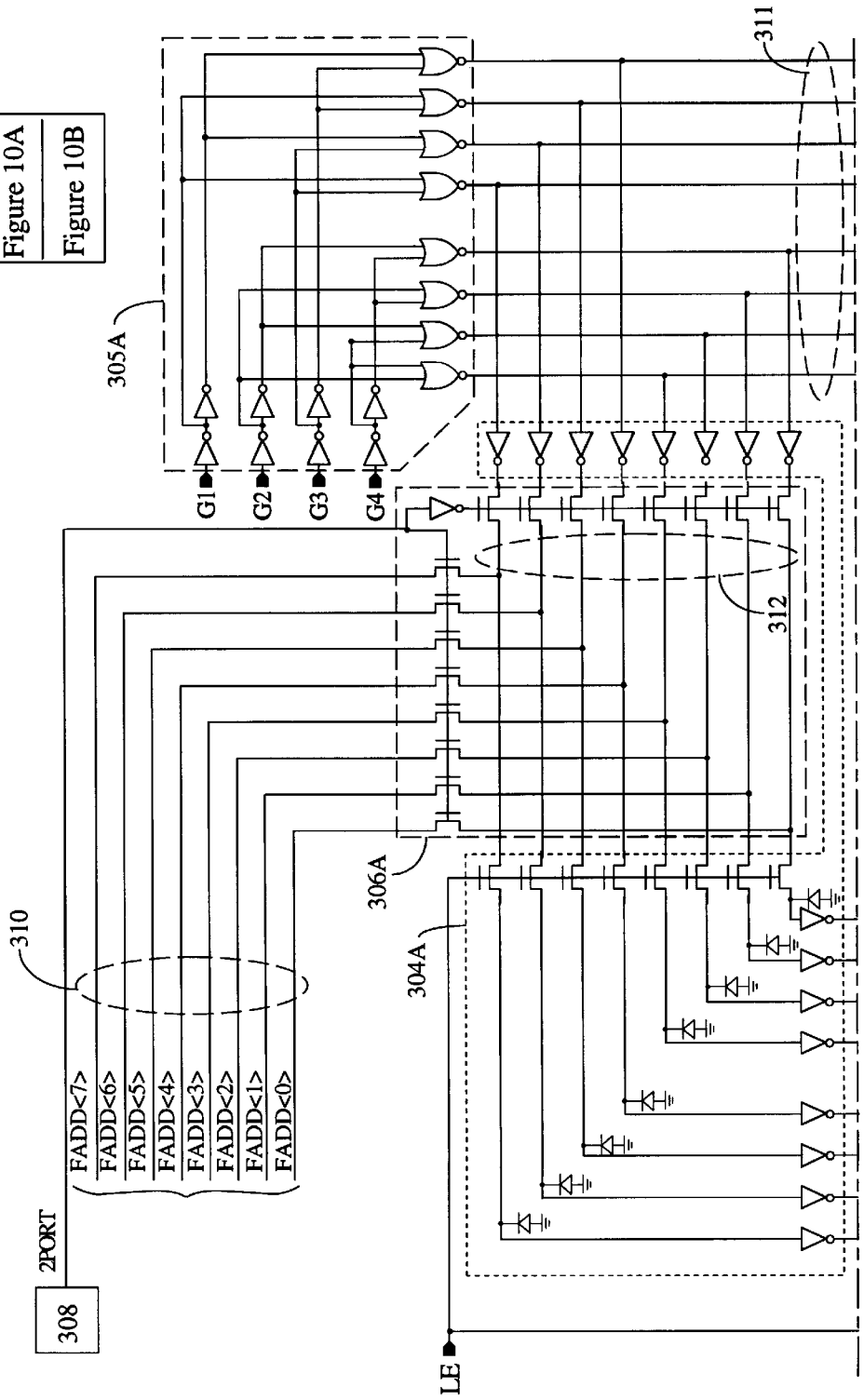
Figure 10B:
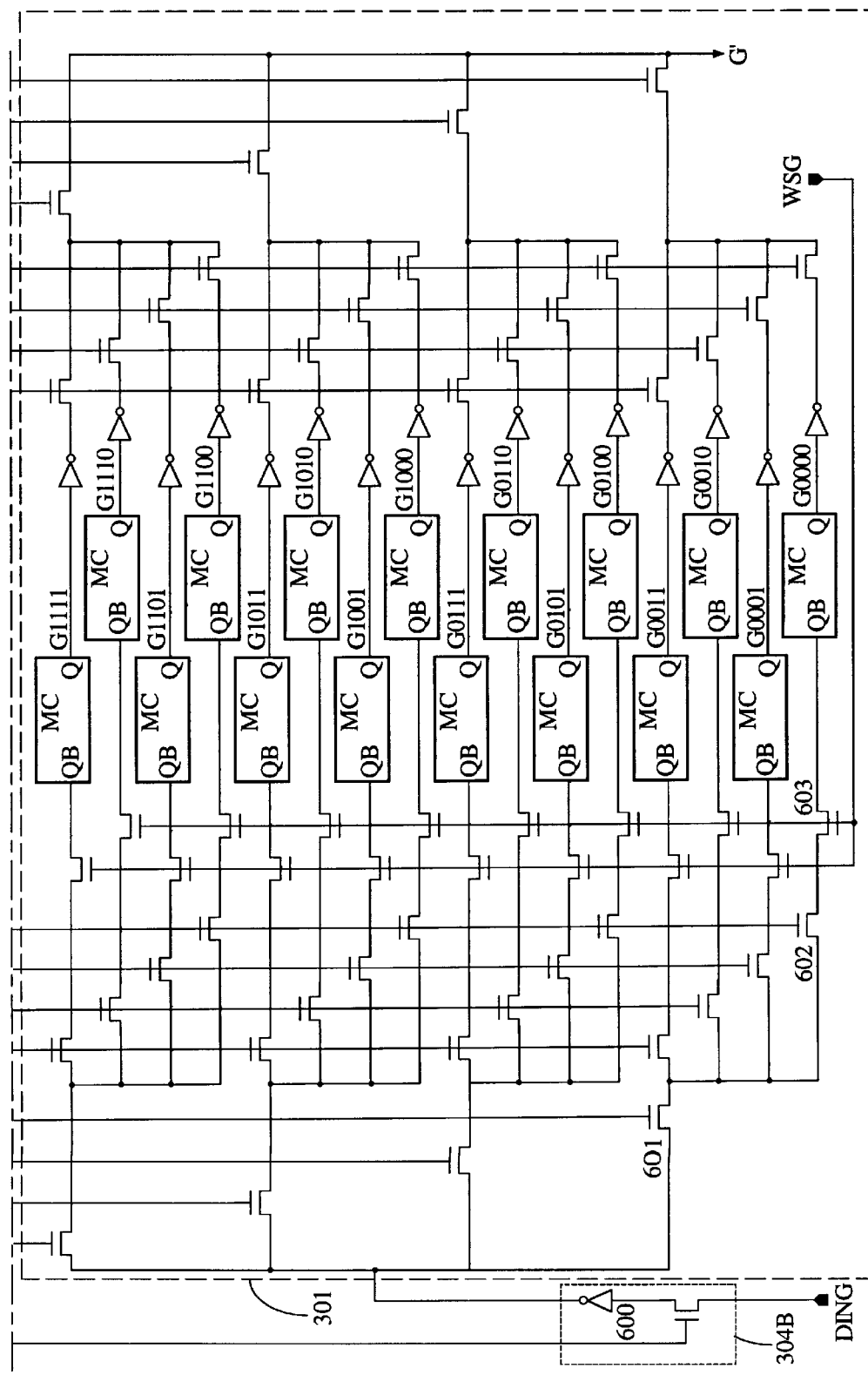

FIGS. 8, 9 and 10

Figure 8B:
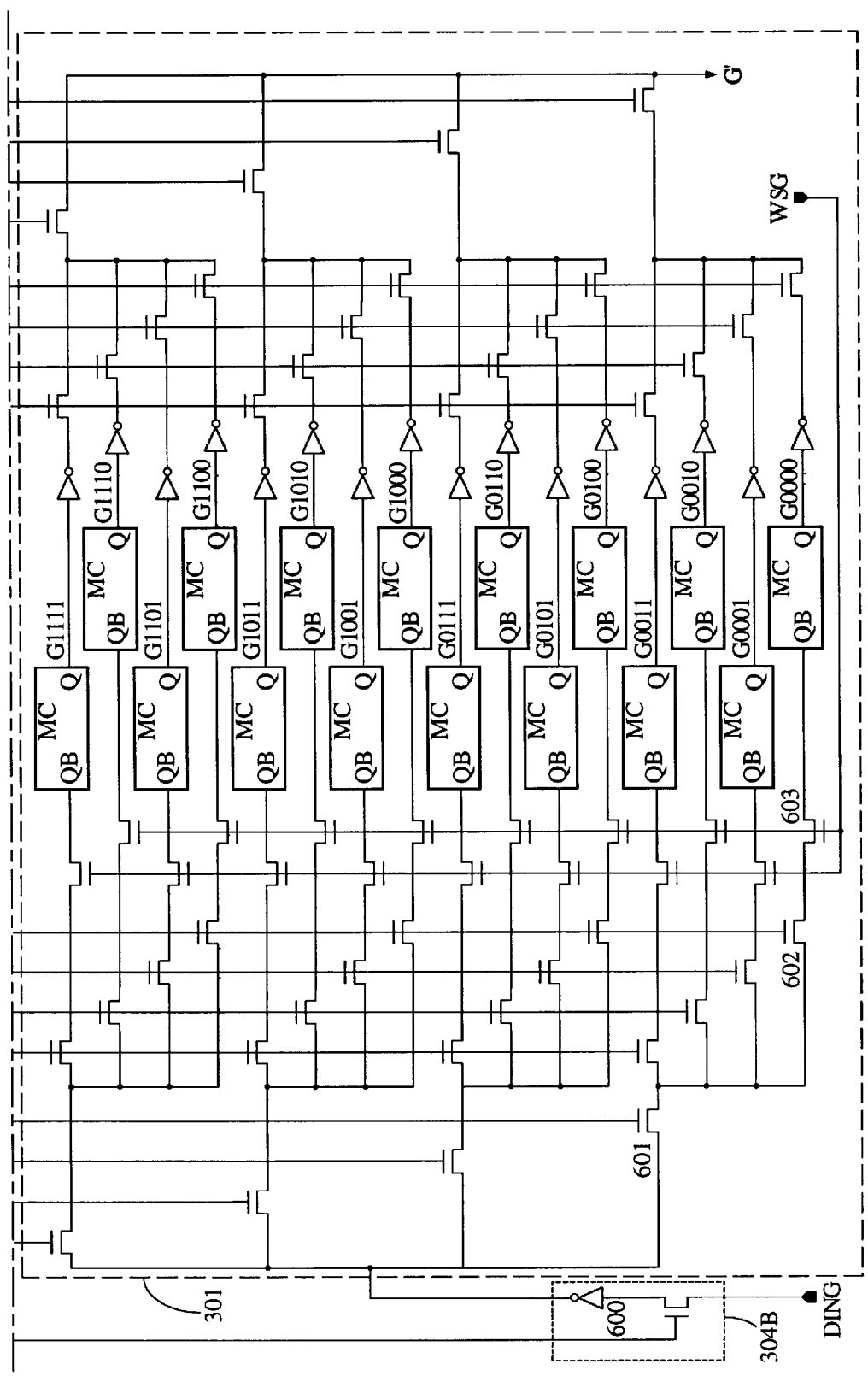

FIG. 8 appears on two separate drawing sheets as FIG. 8A and FIG. 8B. FIG. 8 shows the single-port RAM and its control latches (identified in FIG. 6) for controlling G function generator 301. The same circuit exists for the F function generator, and is not separately shown. Address decode unit 305A receives the four input signals G1 through G4 and partly decodes these signals to generate eight signals 311. These eight signals are provided to eight-bit dynamic address latch 304A. Both dynamic address latch 304A and dynamic data latch 304B are controlled by latch enable signal LE. When latch enable signal LE is low, the dynamic latches are latching. Thus in the embodiment of FIGS. 6–14, latch enable signal LE must remain low only for brief periods of time. The address on lines G1 through G4 selects one of the 16 memory cells MC into which to write data from data-in line DIN. Writing occurs in response to write strobe WSG. It can be seen in FIG. 8B that data must be stable in dynamic latch 304B and the path to the desired memory cell MC must be connected as determined by dynamic latches 304A when WSG goes high, so that the data on DIN will be properly written into the addressed memory cell. For example, to load data into memory cell G0000, transistors 601 and 602 must be on when WSG goes high (turning on transistor 603), and the data must be present in latch 304B.

FIGS. 9 and 10 show the two ports of the dual-port RAM identified in FIG. 7. These figures differ from FIG. 8 in that FIG. 9 includes lines 310 for providing the F address FADD to the G function generator, and FIG. 10 includes multiplexer 306A for selecting between the F address signals 310 and the G address signals 311 to generate address signals 312.

Figure 11A:
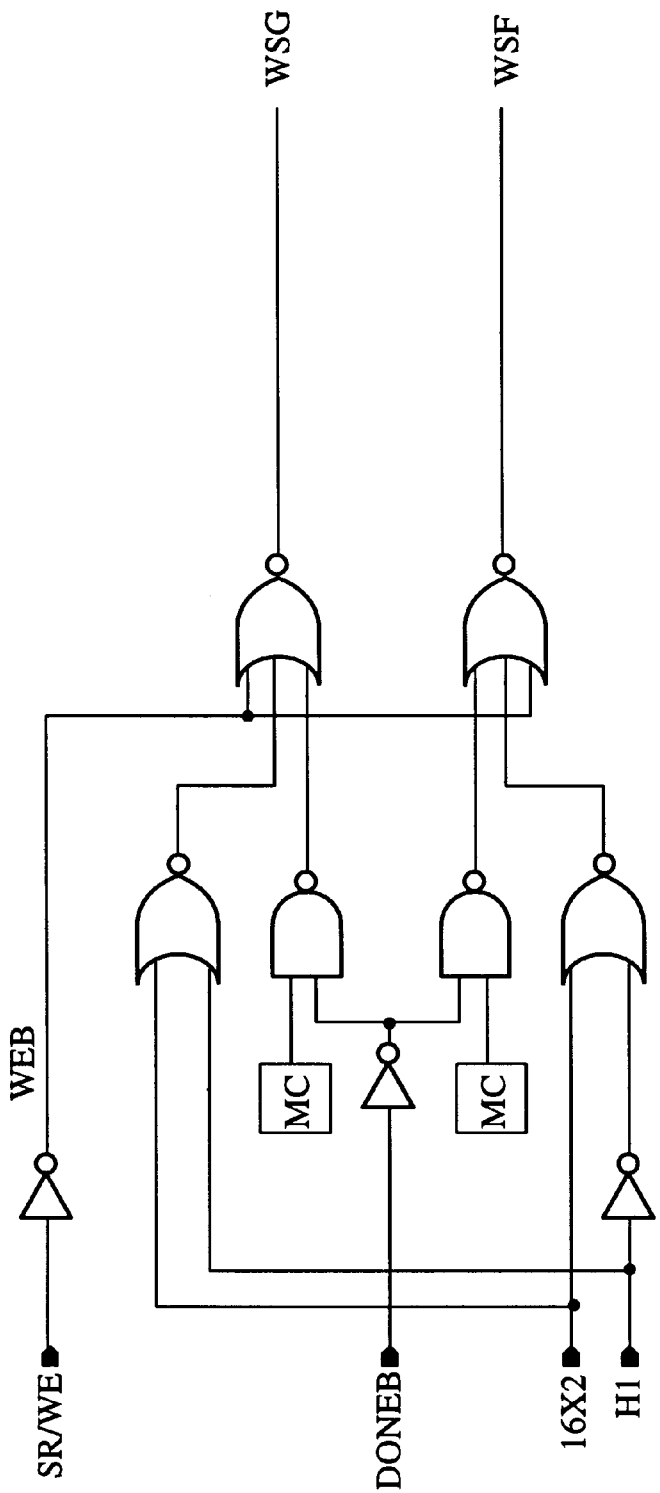
FIG. 11a shows a prior art write strobe logic circuit for an asynchronous RAM.

FIGS. 11a and 1b

Figure 1:
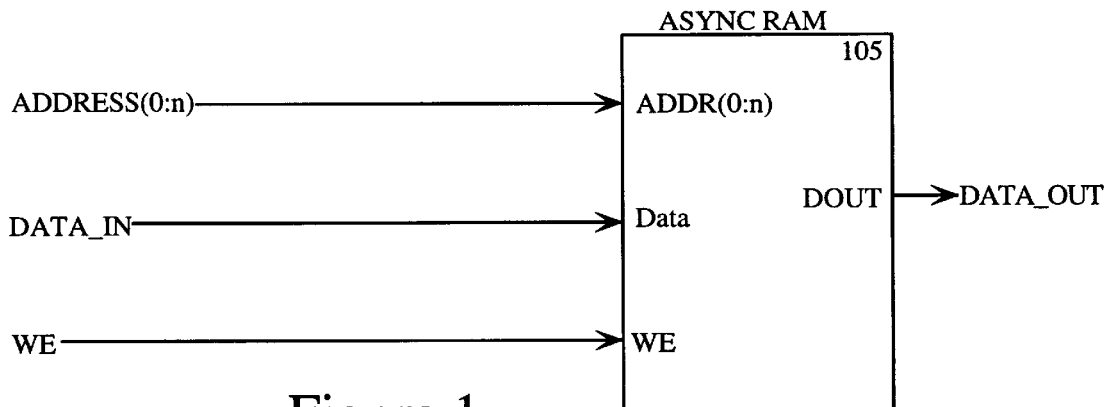
FIG. 1 shows a prior art asynchronous RAM.
Figure 1A:
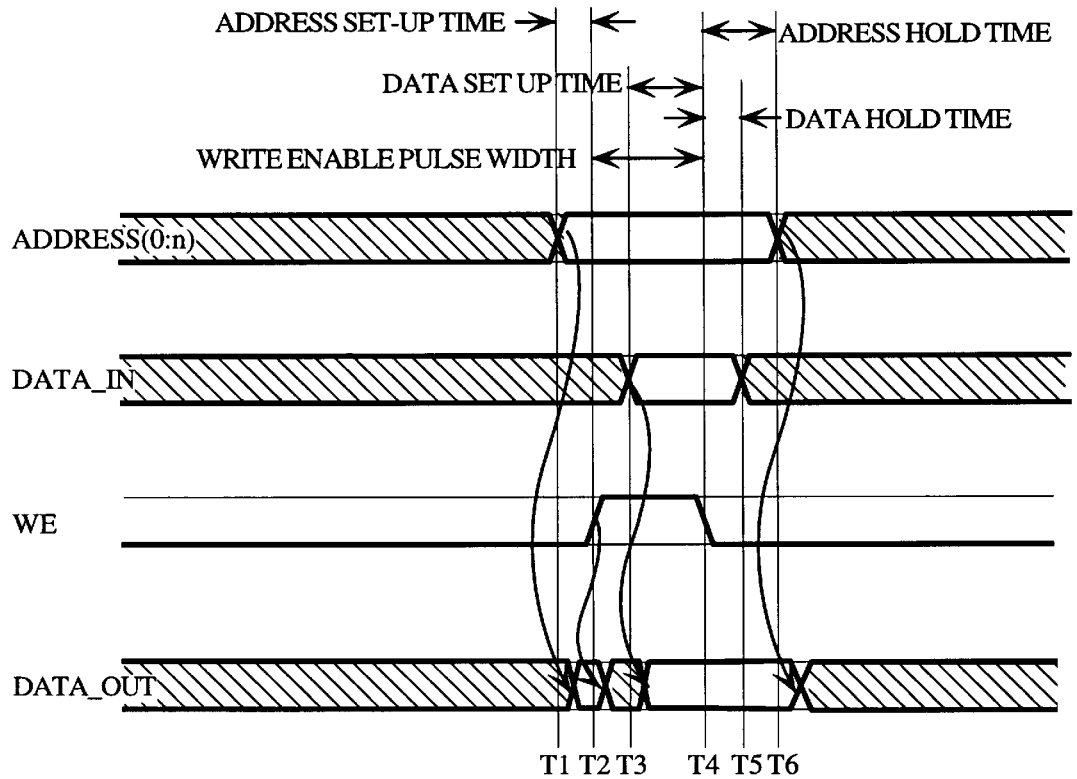
FIG. 1a shows a timing diagram for signals in the asynchronous RAM of FIG. 1.
Figure 11B:
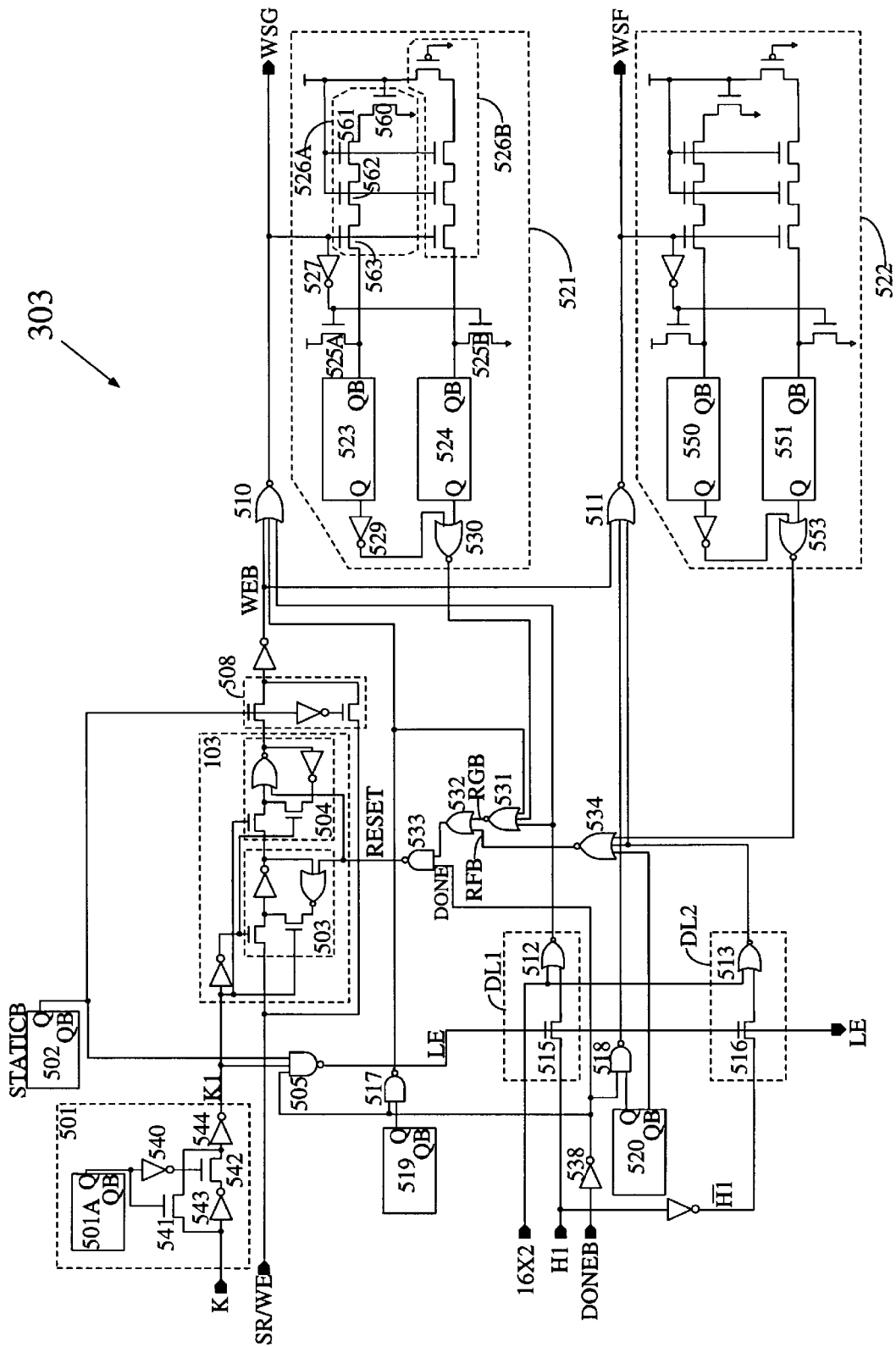
FIG. 11b shows the prior art write strobe logic structure of FIG. 2 when using dummy circuits for implementing write strobe logic 303 shown in FIG. 6 or FIG. 7.

FIGS. 11a and 11b show two prior art write strobe logic structures for implementing write strobe logic unit 303 of FIG. 6 or FIG. 7. FIG. 11a shows a structure usable with an asynchronous RAM such as shown in FIG. 1. Three control signals DONEB, 16×2, and H1 determine whether the SR/WE signal will generate write strobe signals WSG and WSF or whether the write function will be disabled. The DONEB signal goes low when configuration of the FPGA is done, and allows the FPGA to be put into operation, including such functions as writing to a RAM. The 16×2 signal determines whether the two function generators F and G will operate together as one 16×2 RAM or whether they will operate as two separate RAMs. The H1 signal allows the two 16-bit RAMs to operate as a single 32×1 RAM. Memory cells MC, which are loaded during configuration of the FPGA, can disable the write function and thereby cause the two F and G function generators to operate as lookup tables for generating logic functions. Note that in FIG. 11a, since the structure is intended for an asynchronous RAM, no clock or latch enable signals are present.

When the circuit of FIG. 11a is used in conjunction with FIG. 6 or FIG. 7, all dynamic latches are considered permanently transparent, with the LE signal connected to a permanent high value. In such an asynchronous situation, none of the latches in FIG. 6 or FIG. 7 are needed or provided.

FIG. 11b shows a prior art write strobe circuit usable with a synchronous or asynchronous RAM. Unit 303 is described in detail in U.S. Pat. No. 5,566,123 [docket X-137]. Briefly, FIG. 11b includes a circuit 501 for optionally inverting clock signal K. Flip flop 103 receives as an input signal the SR/WE write enable signal and as controlled by inverted or non-inverted clock signal K generates an inverted write enable signal WEB. This inverted write enable signal WEB is used for generating two write strobe signals WSG and WSF, shown in FIG. 6 or 7. Flip flop 103, including latches 503 and 504 (labels are the same as in FIG. 2) provides an output signal to multiplexer 508, which can allow flip flop 103 to be bypassed for operating asynchronously. Circuits 521 and 522 generate an appropriate delay equivalent to that of delay unit 104 of FIG. 2, using dummy structures matching structures in other parts of the chip to generate a minimum but sufficient delay.

Other input signals H1, DONEB, and 16×2 disable the RESET signal under certain conditions and also affect write strobe signals WSF and WSG, as discussed by Freidin et al. in U.S. Pat. No. 5,566,123. These signals feed dynamic latches DL1 and DL2, which are controlled by latch enable signal LE. In the structure of FIG. 11b, the LE signal can be disabled (held permanently high) by the DONEB signal or the STATICB signal. However, when not disabled, the LE signal is taken from clock signal K, and would be held low for an indefinite period if clock signal K1 were held high for an indefinite period. In this case the two dynamic latches DL1 and DL2 would float to intermediate states, causing high current and possible destruction of the chip. Counting the two dynamic latches DL1 and DL2 in FIG. 11b, the eight address dynamic latches 304C in the F function generator (FIG. 9), the eight address dynamic latches 304A in the G function generator (FIG. 10), the data latch 304D in the F function generator (FIG. 9) and the data latch 304B in the G function generator (FIG. 10), latch enable signal LE controls 20 dynamic latches.

FIG. 12

Figure 12:
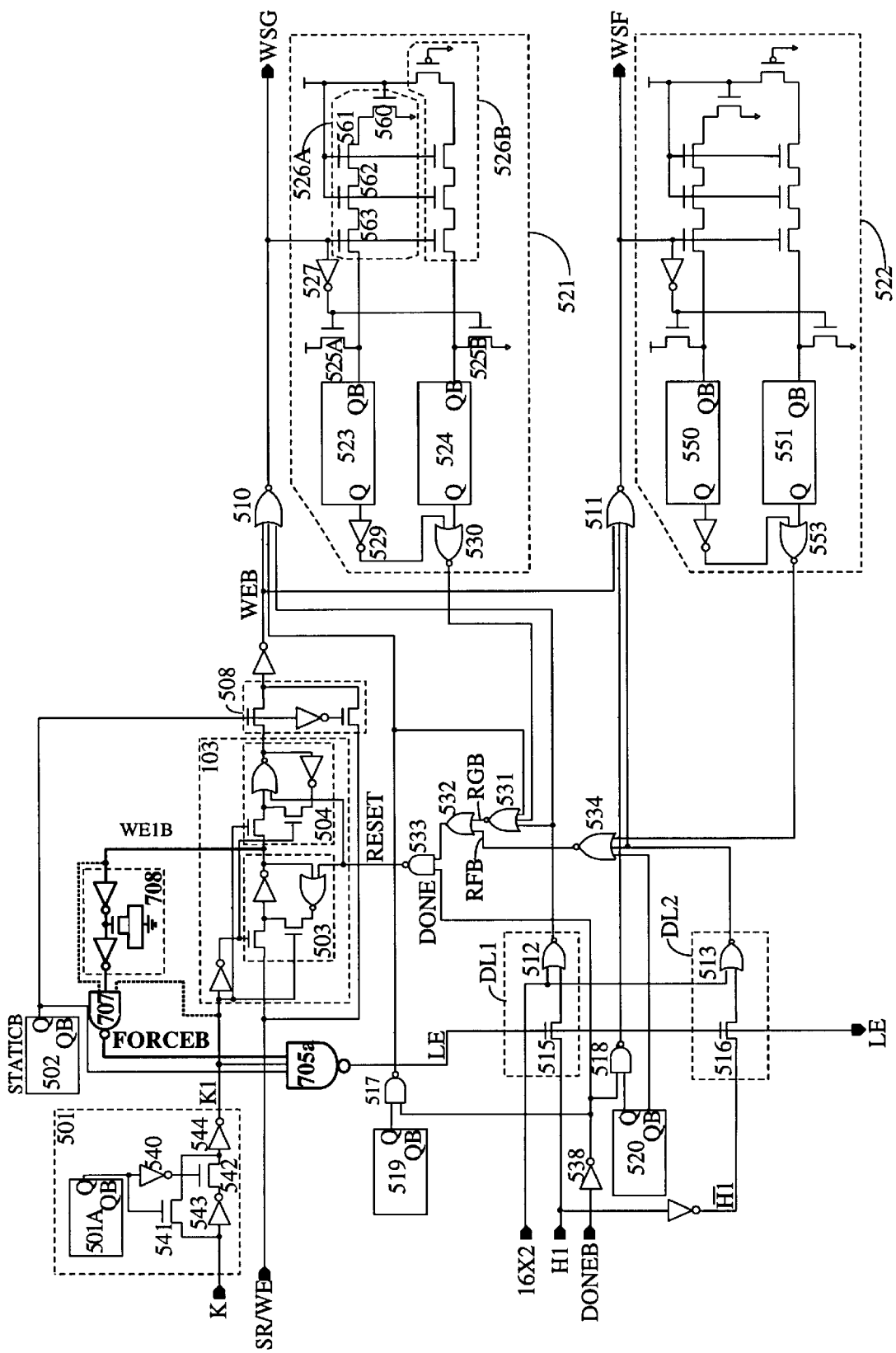
FIG. 12 shows a write strobe logic structure according to the embodiment of FIG. 4 for implementing write strobe logic 303 shown in FIG. 6 or FIG. 7.

FIG. 12 shows a modification to FIG. 11b according to the invention so that latch enable signal LE will not be held permanently low and can safely control the 20 dynamic latches. The modification used in FIG. 12 is according to the embodiment of FIG. 4. NAND gate 705a is equivalent to AND gate 505 of FIG. 4. In FIG. 12, if clock signal K1 continues to provide a high input to NAND gate 705a after RESET rises, then signal WE1B will go high, so that after the delay of circuit 708, the FORCEB signal will go low, causing NAND gate 705a to output a high signal regardless of the state of clock signal K. The inverters within delay circuit 708 are advantageously constructed such that the delay in response to a rising WE1B signal is greater than the delay in response to a falling WE1B signal. The dashed inputs to NAND gate 707 are not required, but may relax the SR/WE setup time requirement. If neither input is used, then NAND gate 707 degenerates to an inverter.

FIG. 13

Figure 13:
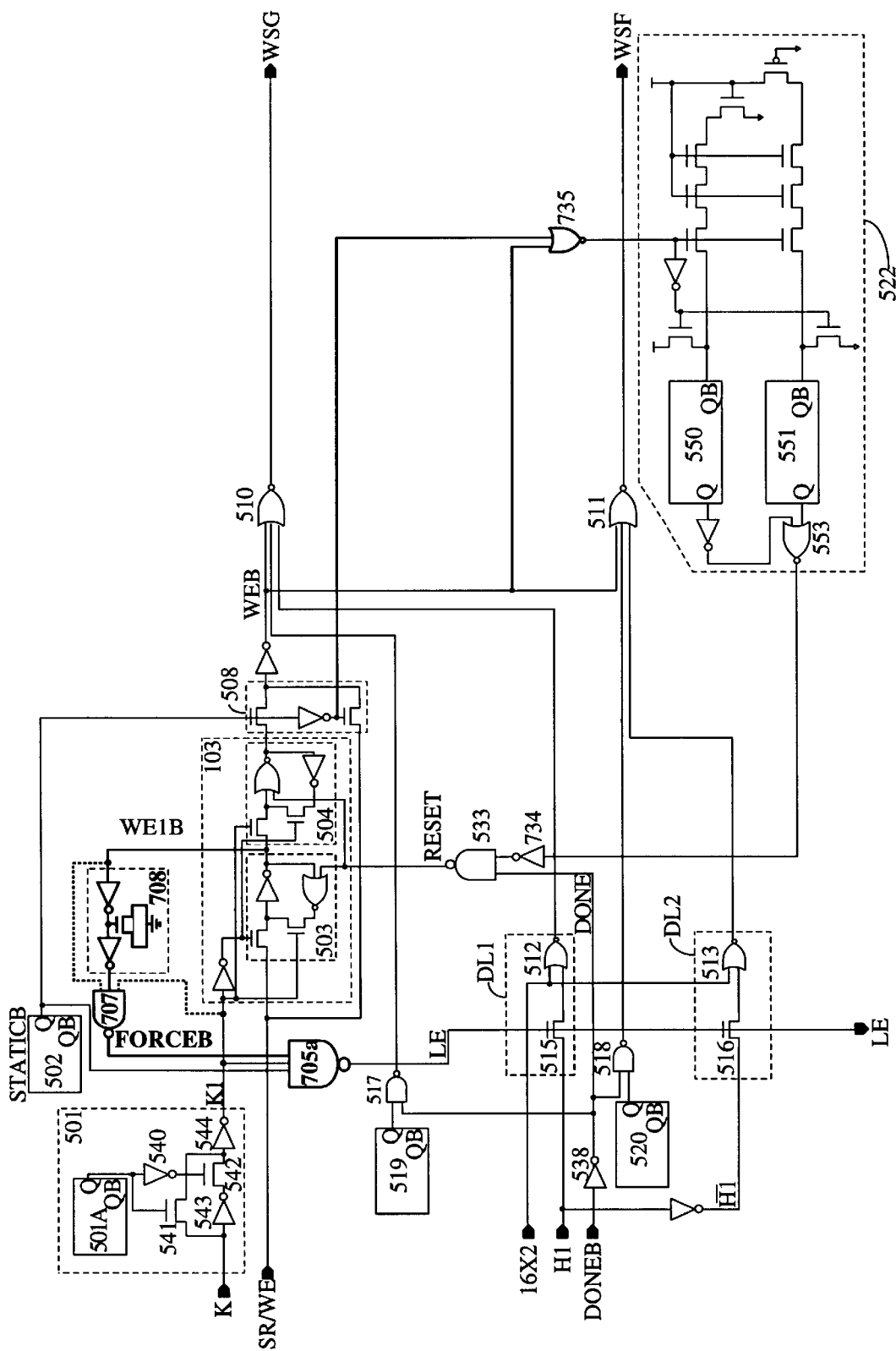
FIG. 13 shows a write strobe logic structure according to the embodiment of FIG. 4 with a simplified dummy circuit.

FIG. 13 shows a write strobe logic structure according to the embodiment of FIG. 4 with a simplified dummy circuit structure. Dummy circuit 521 is eliminated and the logic for generating the RESET signal is simplified by eliminating NOR gates 531 and 534. OR gate 532 is also not needed.

Dummy circuit 522 is controlled directly from write enable signal WEB. NOR gate 735 is included to make the sense of the write enable signal the same as WSF and WSG. And the dummy circuit output signal, inverted by inverter 734 is combined with the DONEB signal in NAND gate 533 to generate the RESET signal. This arrangement saves area. Because NOR gate 735 also disables dummy circuit 522 in asynchronous or non-RAM modes, and because only one dummy circuit is active in synchronous RAM mode, this arrangement also saves power. The drawback of FIG. 13 with respect to FIG. 12 is that dummy circuit 522 is activated not by the write strobe signals WSG and WSF, but from a signal that emulates them. Thus the delay of dummy circuit 522 is not so precisely controlled.

FIG. 14

Figure 14:
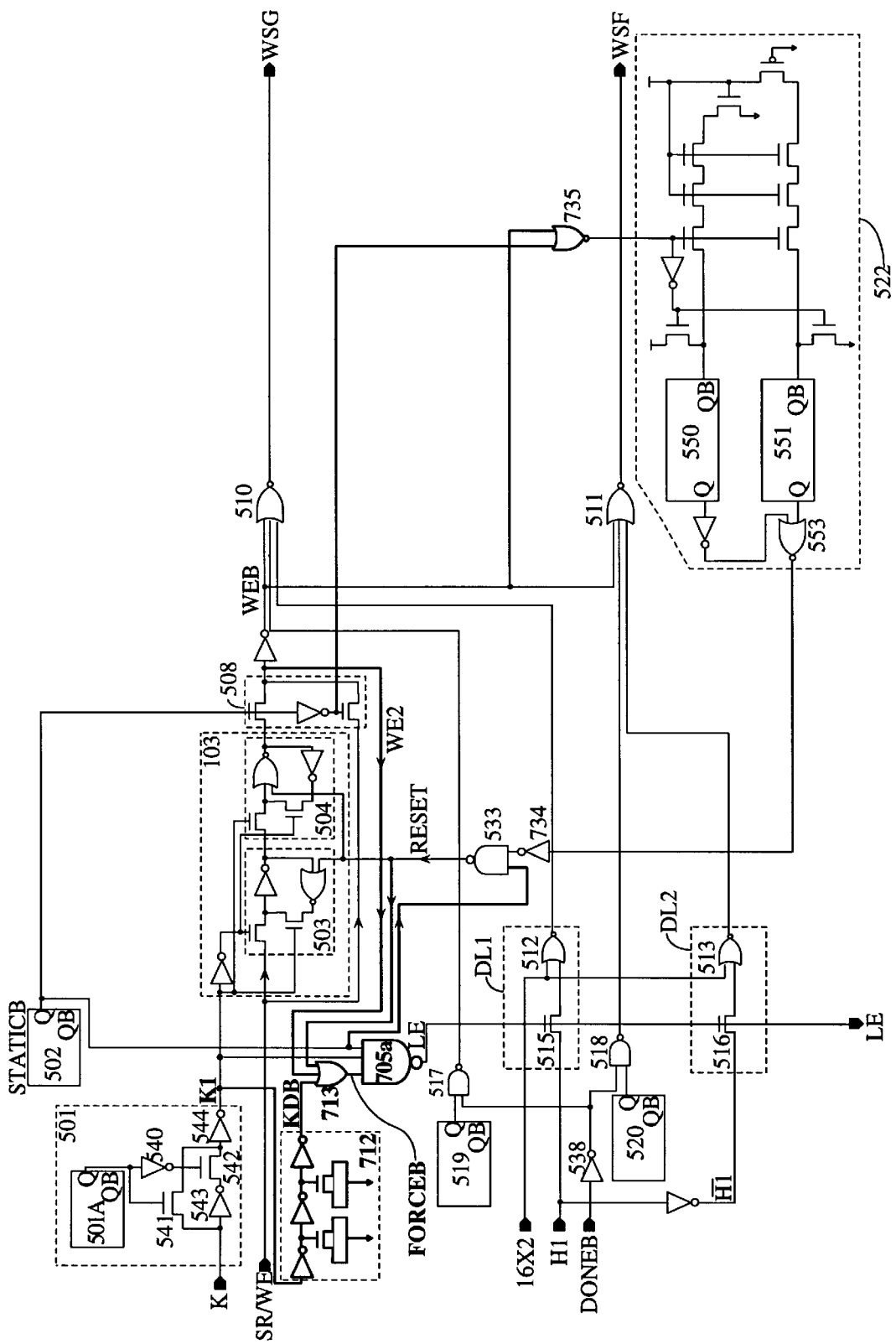
FIG. 14 shows a write strobe logic structure according to the embodiment of FIG. 5 for implementing write strobe logic 303 shown in FIG. 6 or FIG. 7 with the simplified dummy circuit.

FIG. 14 shows a write strobe logic structure according to the embodiment of FIG. 5 for implementing write strobe logic 303 of FIG. 6 or FIG. 7. The embodiment of FIG. 14 uses the simplified dummy circuit shown in FIG. 13. In FIG. 14, delay circuit 712 receives clock signal K1, which is inverted or noninverted from clock signal K, inserts a delay and an inversion, and provides signal KDB to OR gate 713. The inverters within delay circuit 712 are advantageously constructed such that the delay in response to a rising K1 signal is greater than the delay in response to a falling K1 signal. The RESET signal generated by delay circuit 522 is also provided to OR gate 713. OR gate 713 also receives a write enable signal WE2 derived from SR/WE (either synchronously through flip flop 103 or directly from the SR/WE signal. (Finally, as in other embodiments, all latches can be disabled by a logic 0 in STATICB memory cell 502.) Clock signal K1 is provided to NAND gate 705a, which generates the latch enable signal LE. NAND gate 705a only generates a low LE output signal when three things are true: K1 is high, FORCEB is high, and a high output of memory cell 502 configures the RAM (through multiplexer 508) to operate in synchronous mode. However, when K1 is high and memory cell 502 selects synchronous RAM mode, signals KDB, WE2, and RESET will all become low after the two delays generated in circuits 522 and 712 and their downstream logic gates have expired. Thus, the FORCEB signal will go low and LE will go high well before the voltage within any of the dynamic latches has drifted appreciably.

It is to be noted that the RESET signal of FIG. 14 is not based on the DONEB signal, as it is in FIGS. 11–13. This is advantageous because if the following conditions are true: DONEB is high, the RAM controlled by write strobe signals WSF and WSG is operating in synchronous mode, and signal K1 is high for several milliseconds while RESET is high, then LE will remain low for several milliseconds, resulting in high supply current and possible chip damage. Thus the RESET signal must remain low during configuration in order to prevent LE from remaining low. This is accomplished by removing the DONEB input to NAND gate 533. Nonetheless, we can be confident that D flip flop 103 will reset during the configuration, because in synchronous mode RESET will go high if WE2 is high since WEB will be low and thus the output of dummy delay circuit 522 will be high. In asynchronous mode, RESET is always high because the STATICB input of NAND gate 533 is low.

In light of the above description in combination with the drawings, other embodiments of the invention will become obvious to those skilled in the art. Such additional embodiments are intended to fall within the scope of the present invention.

We claim:

1. A synchronous RAM comprising:
   an asynchronous RAM including an address port, a data port, and a write enable port, wherein write operations to said asynchronous RAM are performed in response to a write strobe pulse applied to said write enable port;
   a clock terminal for receiving a clock signal;
   a write enable terminal for receiving a write enable signal;
   at least one dynamic latch providing a latched signal to said asynchronous RAM in response to a latch enable signal; and
   a control circuit coupled to said at least one dynamic latch and said write enable port, said control circuit being formed to assert the write strobe pulse and the latch enable signal in response to the clock signal and the write enable signal, the control circuit asserting the latch enable signal in response to a transition of the clock signal, and de-asserting the latch enable signal at a defined time after the write strobe pulse is asserted.

2. The synchronous RAM of claim 1, wherein said at least one dynamic latch comprises an address latch and said latched signal to said asynchronous RAM is an address signal to said address port.

3. The synchronous RAM of claim 1, wherein said at least one dynamic latch comprises a data latch and said latched signal to said asynchronous RAM is a data signal to said data port.

4. The synchronous RAM of claim 1, further comprising means for bypassing said control circuit and said at least one dynamic latch and thereby operating said synchronous RAM as an asynchronous RAM.

5. The synchronous RAM of claim 4, wherein said means for bypassing comprises a multiplexer controlled by a select signal for selecting between synchronous and asynchronous write operations, said multiplexer receiving said write strobe pulse and said write enable signal, and providing a selected one of said write strobe pulse and said write enable signal to said write enable port.

6. The synchronous RAM of claim 1, wherein said control circuit comprises:
   a storage circuit coupled to receive the clock signal and the write enable signal, the storage circuit asserting the write strobe pulse in response to the clock signal and the write enable signal;
   a first delay circuit coupled to receive the write strobe pulse, the first delay circuit being configured to generate a reset signal which is a delayed version of the write strobe pulse, the write strobe pulse being de-asserted in response to the reset signal;
   a second delay circuit coupled to receive the clock signal, the second delay circuit being configured to generate a delayed clock signal which is a delayed version of the clock signal;
   a first logic gate coupled to receive the delayed clock signal, the reset signal and the write strobe pulse, wherein the first logic gate generates a forcing signal in response to the delayed clock signal, the reset signal and the write strobe pulse; and
   a second logic gate coupled to receive the forcing signal and the clock signal, wherein the second logic gate generates the latch enable signal in response to the clock signal and the forcing signal.

7. The synchronous RAM of claim 6, wherein said latch enable signal causes said dynamic latch to enter a transparent state in response to a transition in said forcing signal.

8. The synchronous RAM of claim 1, wherein the control circuit is formed to assert the write strobe pulse when the write enable signal is asserted and the clock signal undergoes a transition.

9. The synchronous RAM of claim 1, wherein the control circuit comprises:

a storage circuit coupled to receive the clock signal and the write enable signal, the storage circuit asserting an intermediate write enable signal and the write strobe pulse in response to the clock signal and the write enable signal;

a first delay circuit coupled to receive the write strobe pulse, the first delay circuit being formed to generate a reset signal which is a delayed version of the write strobe pulse, the intermediate write enable signal and the write strobe pulse being de-asserted in response to the reset signal;

a second delay circuit coupled to receive the intermediate write enable signal, the second delay circuit being formed to generate a forcing signal which is a delayed version of the intermediate write enable signal; and a logic gate coupled to receive the clock signal and the forcing signal, wherein the logic gate generates the latch enable signal in response to the clock signal and the forcing signal.

10. The synchronous RAM of claim 1, wherein the control circuit comprises:

a storage circuit coupled to receive the clock signal and the write enable signal, the storage circuit asserting the write strobe pulse in response to the clock signal and the write enable signal; and a first delay circuit coupled to receive the write strobe pulse, the first delay circuit being configured to generate a reset signal which is a delayed version of the write strobe pulse, the write strobe pulse being de-asserted in response to the reset signal.

11. The synchronous RAM of claim 10, wherein said first delay circuit comprises an emulation circuit including at least one dummy cell representing cells in said asynchronous RAM.

12. The synchronous RAM of claim 10, wherein said storage circuit comprises a flip flop with a RESET input terminal.

13. The synchronous RAM of claim 12, wherein the first delay circuit is coupled to the flip flop such that the reset signal is applied to said RESET input terminal.

14. The synchronous RAM of claim 13, wherein said first delay circuit comprises a logic gate receiving as input signals a delayed write strobe pulse and a disabling signal, said logic gate applying said delayed write strobe pulse to said RESET input terminal when said disabling signal is not active.

15. The synchronous RAM of claim 10, further comprising:

a second asynchronous RAM including a second address port, a second data port, and a second write enable port, wherein write operations to said second asynchronous RAM are performed in response to a second write strobe pulse applied to said second write enable port.

16. The synchronous RAM of claim 15, wherein said first delay circuit comprises an emulation circuit including at least one dummy cell representing cells in said asynchronous RAM and said second asynchronous RAM.

17. The synchronous RAM of claim 5, wherein said storage circuit comprises:

a flip flop comprising a master latch driving a slave latch, the slave latch generating said write strobe pulse, the master latch and the slave latch being coupled to receive the reset signal.

18. The synchronous RAM of claim 10, wherein the storage circuit is configured to generate an intermediate signal in response to the reset signal, the control circuit further comprising a second delay circuit configured to generate a forcing signal in response to the intermediate signal, wherein the second delay circuit provides a defined delay to the intermediate signal to create the forcing signal, and wherein the latch enable signal is de-asserted in response to the forcing signal.

* * * * *